United States Patent
Lee et al.

(10) Patent No.: US 6,500,747 B1
(45) Date of Patent: Dec. 31, 2002

(54) METHOD OF MANUFACTURING GAN SEMICONDUCTOR SUBSTRATE

(75) Inventors: Won-seok Lee, Seoul (KR); Ok-hyun Nam, Seoul (KR); Cheol-soo Sone, Kyungki-do (KR)

(73) Assignee: Samsung Electro-Mechanics Co., Ltd. (KR)

( * ) Notice: Subject to any disclaimer, the term of this patent is extended or adjusted under 35 U.S.C. 154(b) by 0 days.

(21) Appl. No.: 09/682,746

(22) Filed: Oct. 12, 2001

(30) Foreign Application Priority Data

Apr. 17, 2001 (KR) .......................... 2001-20496

(51) Int. Cl.[7] ..................... H01L 21/28; H01L 21/3205
(52) U.S. Cl. ................. 438/604; 438/478; 438/503; 438/974
(58) Field of Search ................ 438/39–44, 96, 438/412, 460, 462, 478–81, 483, 488, 489, 492, 493, 498, 502, 503, 507, 509, 604, 930, 931, 942, 974; 257/76, 94, 96, 103

(56) References Cited

U.S. PATENT DOCUMENTS

| | | | |
|---|---|---|---|
| 6,051,849 A | | 4/2000 | Davis et al. |
| 6,225,650 B1 | * | 5/2001 | Tadatomo et al. .......... 257/190 |
| 6,252,261 B1 | * | 6/2001 | Usui et al. ................ 257/190 |
| 6,265,289 B1 | * | 7/2001 | Zheleva et al. ............. 438/503 |
| 6,294,440 B1 | * | 9/2001 | Tsuda et al. ............... 436/479 |

* cited by examiner

*Primary Examiner*—Vinh P. Nguyen
*Assistant Examiner*—Asok Kumar Sarkar
(74) *Attorney, Agent, or Firm*—Burns, Doane, Swecker & Mathis, L.L.P.

(57) ABSTRACT

A method of manufacturing a semiconductor substrate is provided. The method includes a first step of forming a rugged portion in a GaN substrate, and a second step of forming a GaN thin film on the GaN substrate at a lateral growth rate fast enough to cover the GaN thin film vertically grown with the GaN thin film laterally grown, so that the rugged portion is covered with the GaN thin film.

8 Claims, 9 Drawing Sheets

METHOD OF MANUFACTURING GAN SEMICONDUCTOR SUBSTRATE

BACKGROUND OF INVENTION

1. Field of the Invention

The present invention relates to a method of manufacturing a semiconductor substrate, and more particularly, to a method of manufacturing a high grade GaN substrate.

2. Description of the Related Art

GaN is a material widely used for transistors, field emitters and optical devices as well as microelectronics devices. GaN is used for producing various kinds of compound semiconductor materials such as AlGaN, InGaN and AlInGaN.

A GaN layer is usually grown on a sapphire substrate or a silicon carbide (SiC) substrate. However, since the lattice constant of a sapphire substrate or silicon carbide substrate is different from that of a GaN layer, the GaN layer grown on the sapphire substrate or silicon carbide substrate contains many small crystal grains of a hexagonal system. The crystal grains have a high defect density and a warped and rotary distribution provoking a broad X-ray rocking curve. Here, the defective density of a GaN layer is about $10^{8-10}/cm^2$.

Figure 3:
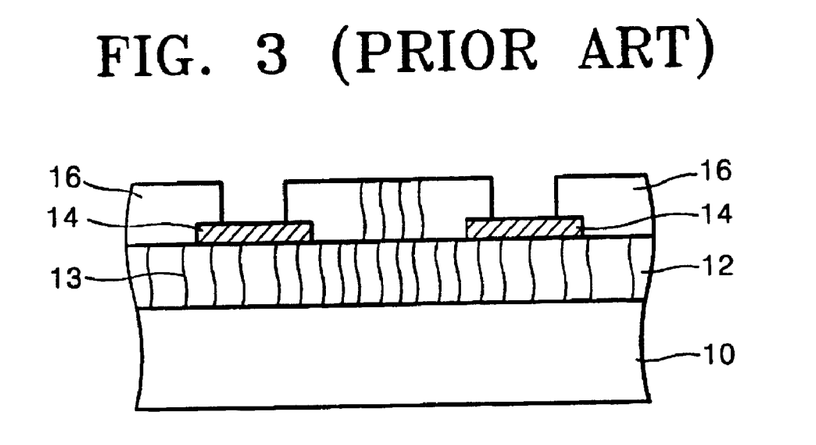
Figure 4:
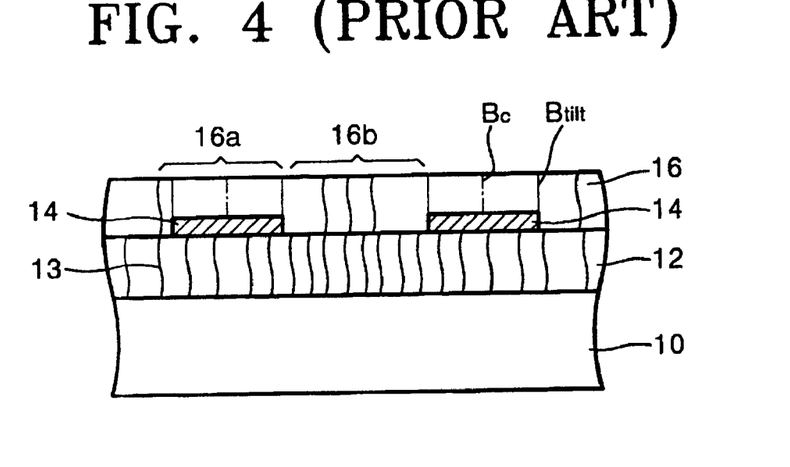
Figure 5:
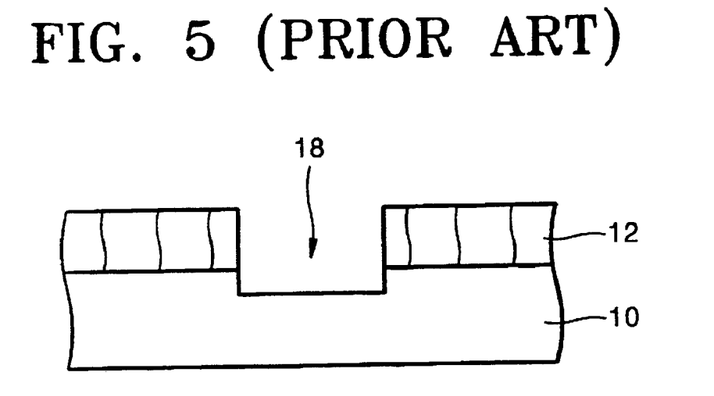
FIGS. 5 and 6 are sectional views of the steps of a method of manufacturing another conventional high-grade GaN substrate.
Figure 6:
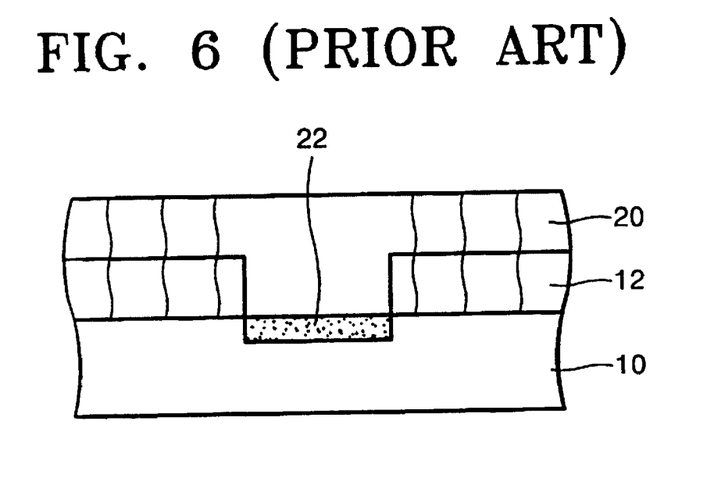

As the defect density of a GaN layer decreases, the applicability of the GaN layer increases. Accordingly, a variety of GaN layer manufacturing methods for lowering the defect density of a GaN layer have been proposed. FIGS. 1 through 4 show one of these methods step by step. FIGS. 5 and 6 show the steps of another method.

Figure 1:
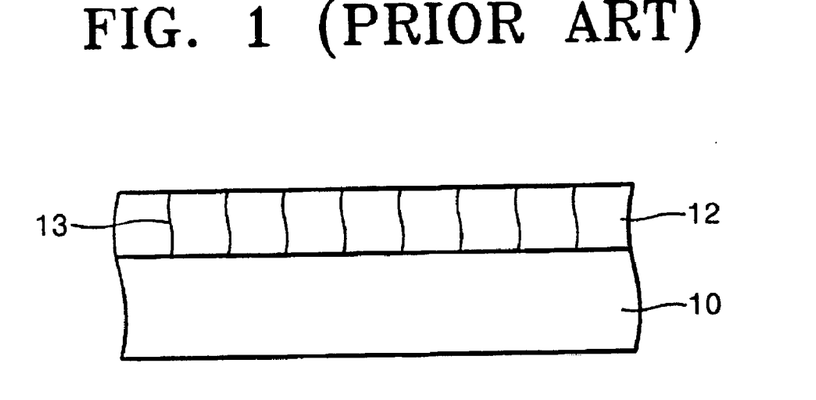
FIGS. 1 through 4 are sectional views of the steps of a method of manufacturing a conventional high-grade GaN substrate.
Figure 2:
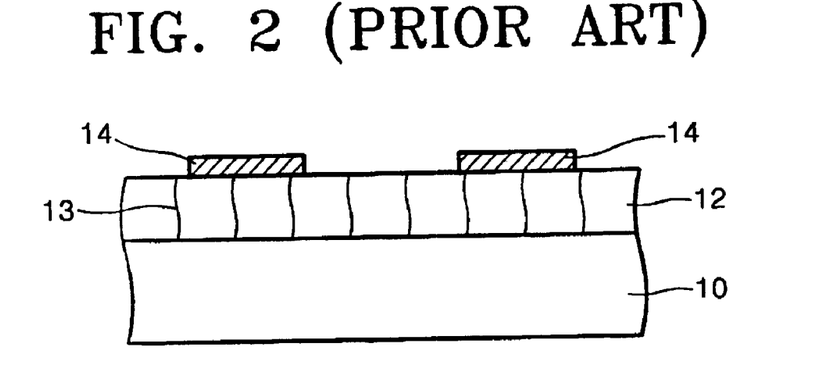

Referring to FIG. 1, a GaN layer 12 is grown on a sapphire substrate (or a silicon carbide substrate) 10. Here, the defect density of the GaN layer 12 is at least $10^8/cm^2$. Reference numeral 13 denotes a symbolized crystalline defect. As shown in FIG. 2, a silicon oxide mask layer 14 is formed in a predetermined pattern on the GaN layer 12. Subsequently, the growth of the GaN layer 12 is continued, as shown in FIG. 3. However, the GaN layer 16 does not vertically grow above the silicon oxide mask layer 14 but vertically grows on an exposed portion which is not covered with the silicon oxide mask layer 14. Thereafter, when the thickness of the vertically grown GaN layer 16 is significantly larger than that of the silicon oxide mask layer 14, the GaN layer 16 laterally grows on the silicon oxide mask layer 14. The GaN layer 16 continuously grows, and finally, the boundaries of the GaN layer 16, which laterally grows starting from both sides of the silicon oxide mask layer 14 and extends on the silicon oxide mask layer 14, meet, as shown in FIG. 4. With such a step, a second GaN layer 16 having a planarized surface is formed on the GaN layer 12 so that the entire surface of the silicon oxide mask layer 14 is covered with the second GaN layer 16. Here, due to the silicon oxide mask layer 14 involved in the growth of the second GaN layer 16, a tilt boundary $B_{tilt}$ is formed within the second GaN layer 16 directly upward from the boundary of the silicon oxide mask layer 14. In addition, a coalesced boundary $B_c$ is formed at a portion where the two boundaries of the second GaN layer 16 growing from both sides of the silicon oxide mask layer 14 meet.

The more detailed description of the above GaN layer growth method is disclosed in U.S. Pat. No. 6,051,849 issued to Davis et al.

The second GaN layer 16 has the following characteristics. As shown in FIG. 4, the second GaN layer 16 has a defect density difference between a first portion 16a formed on the silicon oxide mask layer 14 and a second portion 16b formed between silicon oxide mask layers 14. In other words, the defect density of the first portion 16a is much lower than that of the GaN layer 12, but the defect density of the second portion 16b is almost the same as that of the GaN layer 12. It can be derived from this result that the potential of the GaN layer 12 does not propagate to form the second GaN layer 16 having a lower defect density than the GaN layer 12 when the GaN layer 12 laterally grows, while the potential of the GaN layer 12 propagates resulting in no improvement in a defect density when the GaN layer 12 vertically grows.

Another example of a conventional technique of growing a GaN layer will be described below with reference to FIGS. 5 and 6. Referring to FIG. 5, a GaN layer 12 is grown on a sapphire substrate (or a silicon carbide substrate) 10. A predetermined region of the GaN layer 12 is etched. A trench 18 having a predetermined depth is formed in the sapphire substrate 10 exposed by the etching process. Thereafter, as shown in FIG. 6, in a state in which the GaN layer 12 is formed on the entire surface of the sapphire substrate 10 except the trench 18, a third GaN layer 20 is grown on the sapphire substrate 10 and the GaN layer 12. Here, the third GaN layer 20 does not grow at the etched portion in the sapphire substrate 10, that is, at the trench 18 region, in either direction between vertical and horizontal directions while the third GaN layer 20 grows vertically and horizontally at the portion not etched in the sapphire substrate 10. During this process, the third GaN layer 20 is not formed in the trench 18 region, so the trench 18 remains as a void 22 after completion of the growth of the third GaN layer 20.

As described above, according to a conventional method of growing a GaN layer, a GaN layer is formed first on a sapphire substrate (or a silicon carbide substrate), and a mask layer is formed on the GaN layer or a trench is formed at a predetermined region of the sapphire substrate in order to prevent the potential of the GaN layer from propagating, thereby forming another GaN layer having a lower defect density. Such conventional methods of growing a GaN layer have the following problems.

First, in the case of the first conventional method shown in FIGS. 1 through 4, due to the surface tension difference between the second GaN layer 16 and the silicon oxide mask layer 14, the crystals of the second GaN layer 16 are tilted forming defects at the coalesced boundary. Moreover, during this process, grooves are formed on the surface of the second GaN layer 16.

Second, since a different sort of material such as a silicon oxide mask layer is introduced, a strain distribution in a growing GaN layer is non-uniform.

Third, since the heat conductivity of silicon oxide ($SiO_2$) used to form a mask layer is lower than a GaN layer, the thermal reliability of a device may be degraded when the device is formed on the GaN layer formed on the mask layer.

Fourth, in the case where the void 22 is formed between the grown third GaN layer 20 and the sapphire substrate 10, as shown in FIG. 6, the resistance of a device formed on the third GaN layer 20 increases, which lowers the reliability of the device.

Fifth, the structure of a device may be vulnerable due to the void 22.

Sixth, in the case of the conventional method shown in FIGS. 5 and 6, it is necessary to etch the sapphire substrate 10 to form the trench 18. However, it is not easy to etch the sapphire substrate 10.

SUMMARY OF INVENTION

To solve the above-described problems, it is an object of the present invention to provide a method of manufacturing a high-grade semiconductor substrate without using a mask layer or by preventing crystalline defects from propagating to the surface of a grown semiconductor substrate even if using the mask layer.

To achieve the above object of the invention, there is provided a method of manufacturing a semiconductor substrate including a first step of forming a rugged portion having a predetermined depth in a first semiconductor substrate; and a second step of forming a second semiconductor substrate on the first semiconductor substrate at a lateral growth rate fast enough to cover the GaN thin film vertically grown with the GaN thin film laterally grown so that the rugged portion is covered with the second semiconductor substrate.

Here, the first step includes forming a trench in the first semiconductor substrate, and the second step further includes forming a mask on the first semiconductor substrate around the trench.

Alternatively, the first step includes the sub steps of forming a first rugged portion in the first semiconductor substrate, and transforming the first rugged portion into a second rugged portion.

The first semiconductor substrate is realized as a III-V compound semiconductor substrate, and preferably, as a GaN substrate.

The first rugged portion is formed to include protrusions, the surface of which is composed of a top and a slope bordered by the top, and a recess between the protrusions. The second rugged portion is formed to include a second protrusions having the shape of a pyramid with a sharp point, and a recess between the second protrusions.

According to the present invention, the defect density of a lower semiconductor substrate can be prevented from propagating to an upper semiconductor substrate, thereby obtaining the upper semiconductor substrate having a lower defect density than the lower semiconductor substrate. In addition, a low defect density area in the upper semiconductor substrate is much wider compared to prior art.

BRIEF DESCRIPTION OF DRAWINGS

The above objects and advantages of the present invention will become more apparent by describing in detail preferred embodiments thereof with reference to the attached drawings in which.

DETAILED DESCRIPTION

Hereinafter, embodiments of a method of manufacturing a high-grade semiconductor substrate according the present invention will be described with reference to the attached drawings. In the drawings, the thickness of layers or the shape of regions are exaggerated for clarity. It will also be understood that a first semiconductor substrate, i.e., a base semiconductor substrate, is discriminated from a second semiconductor substrate grown therefrom in the following description and the attached drawings for facilitating description and illustration even if the first semiconductor substrate and the second semiconductor substrate forms a single semiconductor substrate and are not discriminated from each other after completion of growth.

<First Embodiment>

Figure 7:
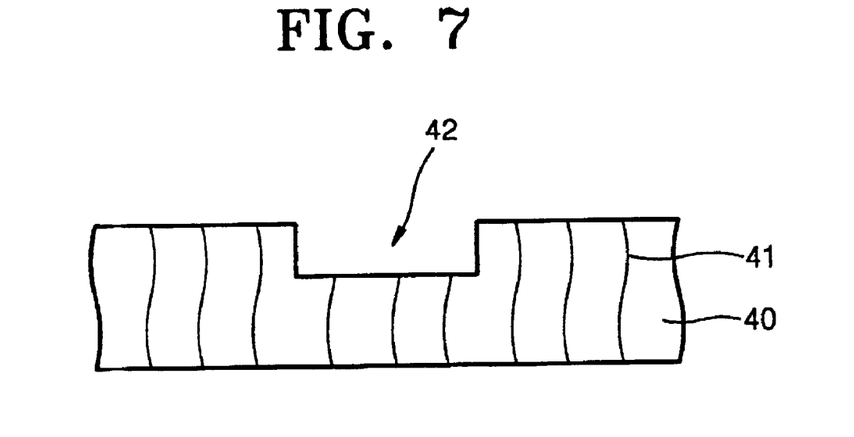
FIGS. 7 through 10 are sectional views of the steps of a method of manufacturing a high-grade semiconductor substrate according to a first embodiment of the present invention.

As shown in FIG. 7, a trench 42 is formed to a predetermined depth in a first semiconductor substrate 40. The first semiconductor substrate 40 is realized as a III-V compound semiconductor substrate. It is preferable to realize the first semiconductor substrate 40 as a nitride semiconductor substrate. It is more preferable to realize the first semiconductor substrate as a gallium nitride (GaN) substrate having a low defect density no greater than $10^7/cm^2$. Reference numeral 41 denotes a symbolized crystalline defect within the first semiconductor substrate 40.

Figure 8:
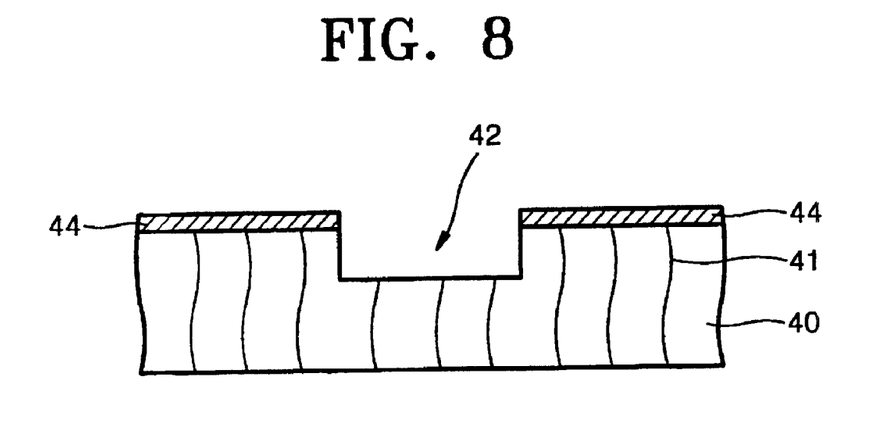

Referring to FIG. 8, a mask 44 is formed on the first semiconductor substrate 40 around the trench 42. Preferably, the mask 44 is formed of oxide, such as silicon oxide ($SiO_2$), or nitride ($SiN_x$). The mask 44 is formed to prevent the defect density of the first semiconductor substrate 40 from propagating to a substrate formed thereon during following processes.

Subsequently, the first semiconductor substrate 40 on which the mask 44 is formed is grown. It is preferable to grow the first semiconductor substrate 40 under the conditions allowing lateral growth to be faster than vertical growth. As a result, an initial second semiconductor substrate 46a grows starting from the sidewall of the trench 42 meeting the mask 44, and some of the second semiconductor substrate laterally grows over the mask 44, as shown in FIG. 9.

Figure 9:
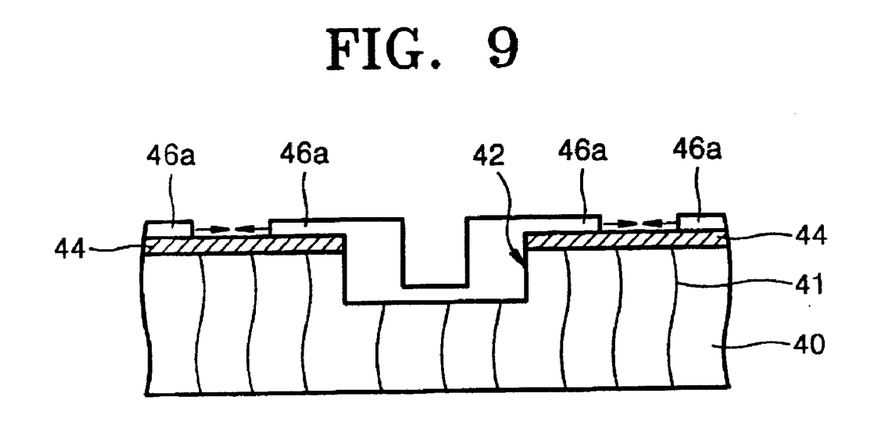

As shown in FIG. 9, since a lateral growth rate is higher than a vertical growth rate, portions laterally grown from the sidewall of the trench 42 meet each other before a portion vertically grown from the bottom of the trench 42 reaches the surface of the first semiconductor substrate 40. In other words, the portion vertically grown from the bottom of the trench 42 is covered with the portions laterally grown from the sidewalls of the trench 42. As a result, propagation of crystalline defects 41 along the vertically grown portion is intercepted. In addition, the crystalline defects 41 of the first semiconductor substrate 40 around the trench 42 are intercepted by the mask 44. Therefore, a semiconductor substrate having a much lower defect density than the first semiconductor substrate 40 is formed on the first semiconductor substrate 40, thereby forming a single semiconductor substrate including a low defect density area wider than the first semiconductor substrate 40.

Figure 10:
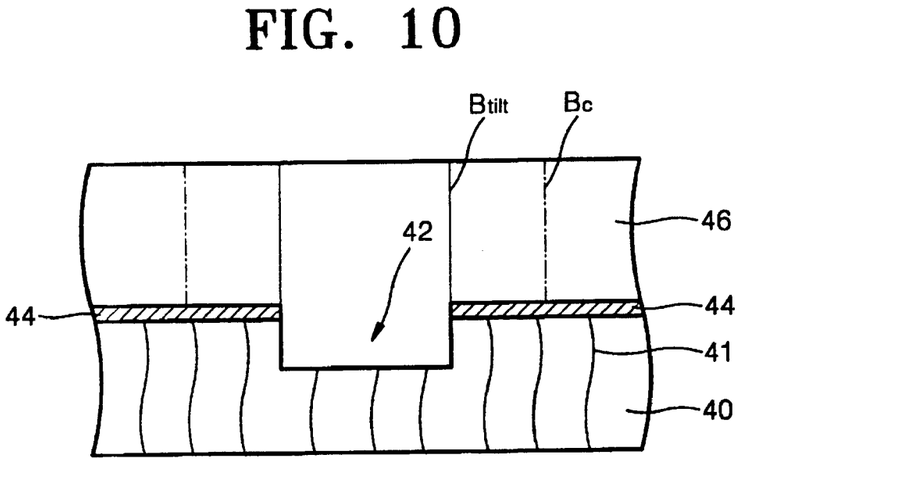

By continuously growing the first semiconductor substrate 40, as shown in FIG. 10, a second semiconductor substrate 46 having the above characteristics is formed. However, a tilt boundary $B_{tilt}$ is formed directly upward from the edge of the mask 44 due to the interaction between the second semiconductor substrate 46 and the mask 44. In addition, a coalesced boundary $B_C$ is formed at the portion where the boundaries of the initial second semiconductor substrate 46a meet each other.

<Second Embodiment>

Figure 11:
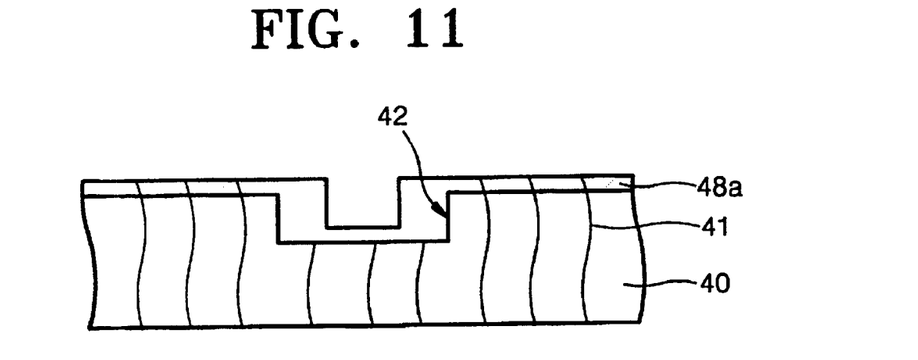
FIGS. 11 and 12 are sectional views of the steps of a method of manufacturing a high-grade semiconductor substrate according to a second embodiment of the present invention.
Figure 12:
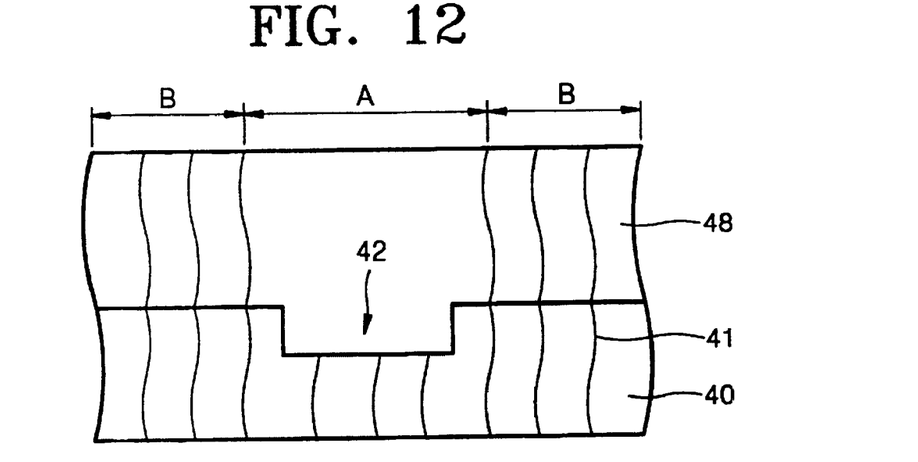

In the first and second embodiments, the same reference numerals denote the same members. As shown in FIGS. 11 and 12, conditions and processes of growing a semiconductor substrate in the second embodiment is the same as those in the first embodiment, with the exception that the mask 44 (refer to FIG. 8) is not formed on the first semiconductor substrate 40 around the trench 42. In other words, it is preferable to grow the first semiconductor substrate 40 under conditions allowing lateral growth to be faster than vertical growth. Accordingly, a lateral growth rate on the sidewall of the trench 42 is much higher than a vertical growth rate on the bottom of the trench 42, so that the thickness of a portion laterally grown from the sidewall of the trench 42 is much greater than that of a portion vertically grown from the bottom of the trench 42 or a portion grown from the first semiconductor substrate 40 except for the trench 40.

As shown in FIG. 12, the defect density of a first portion A of a second semiconductor substrate 48, which is grown on the first semiconductor substrate 40, corresponding to the region of the trench 42 is much lower than that of the first semiconductor substrate 40 because crystalline defects 41 of the first semiconductor substrate 40 do not propagate for the same reason as described in the first embodiment. However, the defect density of a second portion B corresponding to the first semiconductor substrate 40 around the trench 42 is the same as that of the first semiconductor substrate 40 because a mask does not exist on the first semiconductor substrate 40 around the trench 42 and so crystalline defects 41 of the first semiconductor substrate 40 propagate.

However, since a mask does not exist between the first and second semiconductor substrates 40 and 48, a tilt region due to the interaction between the second semiconductor substrate 48 and a mask is not formed. Since a tilt region is not formed, formation of defects at a coalesced boundary and formation of grooves on the surface of a semiconductor substrate can be prevented. In addition, since a mask, which is formed of a material having different physical properties than the first and second semiconductor substrates 40 and 48, is not introduced between the first and second semiconductor substrates 40 and 48, a strain distribution in the second semiconductor substrate 48 is uniform.

FIG. 11 shows one moment of a process in which an initial second semiconductor substrate 48a grows on the first semiconductor substrate 40 in which the trench 42 is formed. Here, the trench 42 is partially filled with the initial second semiconductor substrate 48a, and the first semiconductor substrate 40 around the trench 42 is thinly covered with the initial second semiconductor substrate 48a.

<Third Embodiment>

The third embodiment is characterized by the shape of the surface of a base semiconductor substrate, which is completely different from that of the first or second embodiment. In the first through third embodiments, the same reference numerals denote the same members, and thus a detailed description thereof will be omitted.

Figure 13:
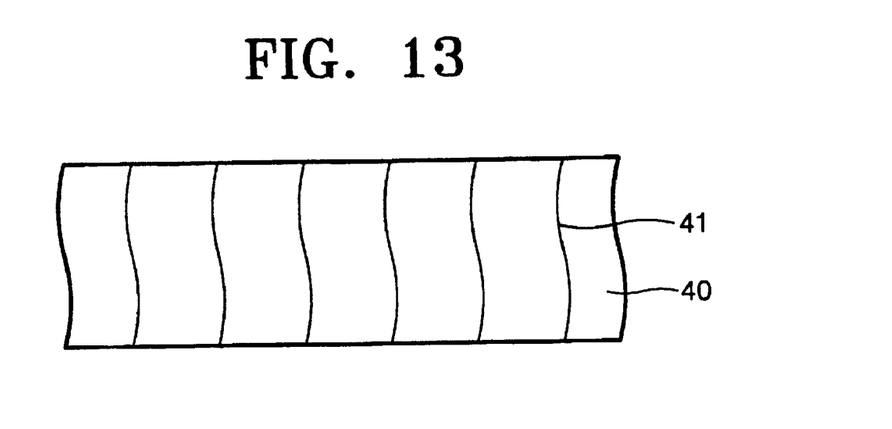
FIGS. 13 through 17 are sectional views of the steps of a method of manufacturing a high-grade semiconductor substrate according to a first embodiment of the present invention.
Figure 14:
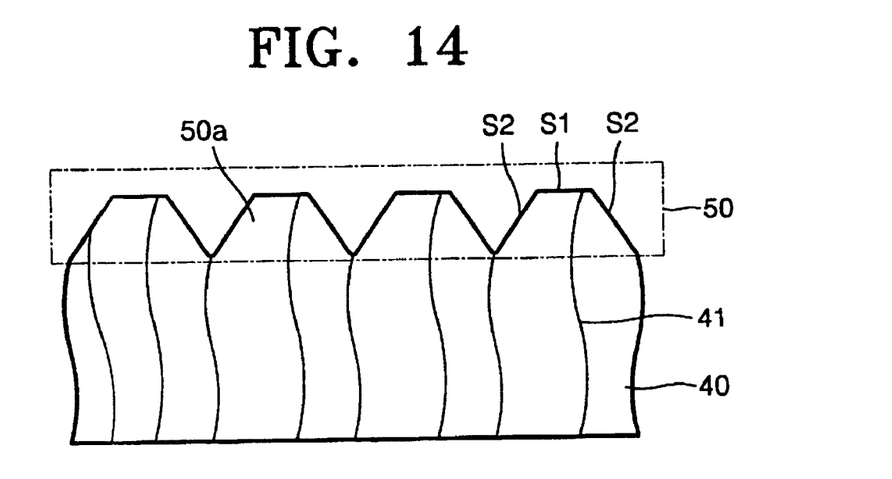

As shown in FIG. 13, a first semiconductor substrate 40 is prepared. The first semiconductor substrate 40 is etched under predetermined conditions, thereby forming a first rugged portion 50, as shown in FIG. 14. In the first rugged portion 50, the surface of a first protrusion 50a is composed of a top S1. and a slope S2 bordered by the top S1.

Figure 15:
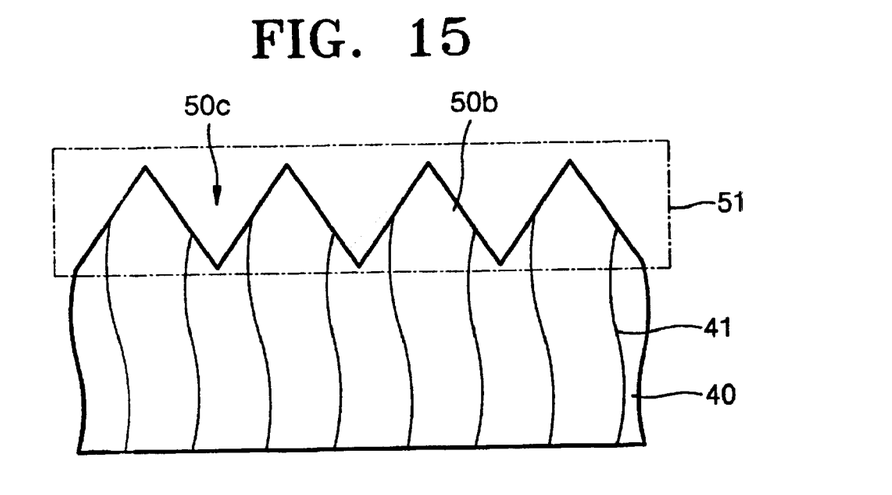

Subsequently, the first rugged portion 50 is transformed into a second rugged portion 51 having a pyramid-shaped second protrusion 50b with a sharp point by an etching method or a growth method.

In other words, the entire surface of the first semiconductor substrate 40 having the first rugged portion 50 is etched, thereby transforming the first rugged portion 50 into the second rugged portion 51. Here, the etching process is performed under conditions suitable for making the shape of the first rugged portion 50 into a pyramid or at least a shape similar to a pyramid.

Alternatively, according to the growth method, the first rugged portion 50 is transformed into the second rugged portion 51 by adjusting the growth conditions of the first semiconductor substrate 40. More specifically, the first semiconductor substrate 40 having the first rugged portion 50 is grown at 900–1100° C., and preferably, at 950–1050° C., thereby transforming the first rugged portion 50 into the second rugged portion 51 having the pyramid-shaped second protrusion 50b.

Figure 17:
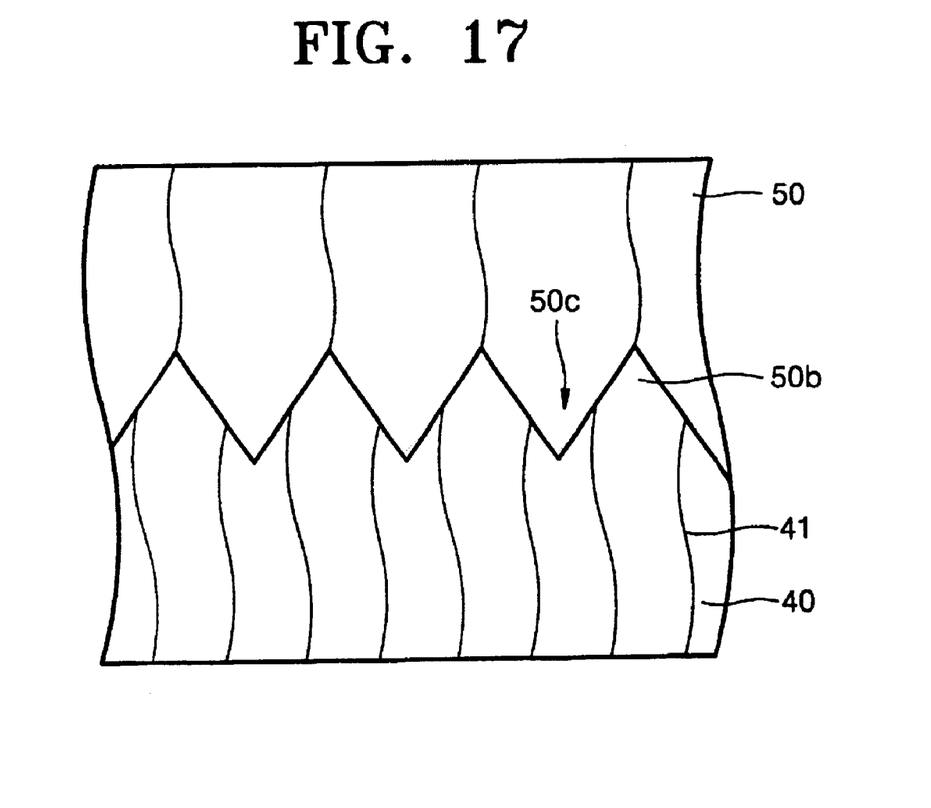

Thereafter, the first semiconductor 40 having the second rugged portion 51 composed of second protrusions 50b with a sharp point in a pyramid shape and recesses 50c therebetween is grown, thereby forming a second semiconductor substrate 52 on the first semiconductor substrate 40 so that the second rugged portion 51 is covered with the second semiconductor substrate 52, as shown in FIG. 17. Here, preferably, the second semiconductor substrate 52 is grown by applying a source gas over the first semiconductor substrate 40 under growth conditions allowing a lateral growth rate to be higher than a vertical growth rate. With such a process, the potential of the first semiconductor substrate 40 propagates to the surface of the second semiconductor substrate 52 only at the sharp point of each second protrusion 50b, and the potential is bent aside along a growth surface at the remaining portion. Accordingly, the high-grade second semiconductor substrate 52 having a much lower defect density than the first semiconductor substrate 40 can be obtained. The growth conditions for the second semiconductor substrate 52 are the same as those for the second semiconductor substrate 46 of FIG. 10 in the first embodiment.

Figure 16:
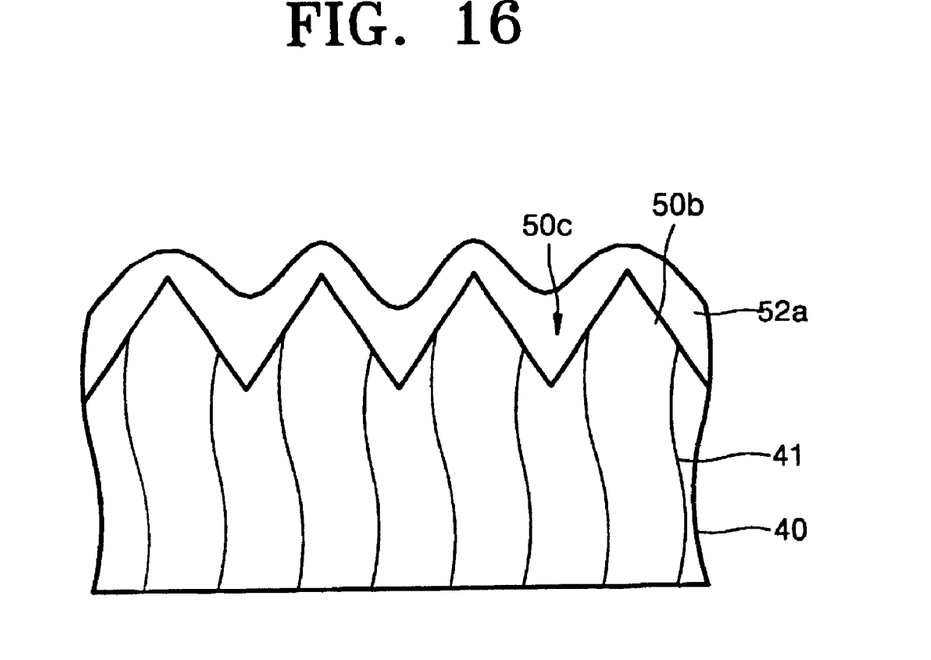

FIG. 16 shows one moment of a process in which the initial second semiconductor substrate 52a is grown from the second rugged portion 51 of the first semiconductor substrate 40. Here, the initial second semiconductor substrate 52a is thinly grown on the entire surface of the second rugged portion 51.

Figure 18:
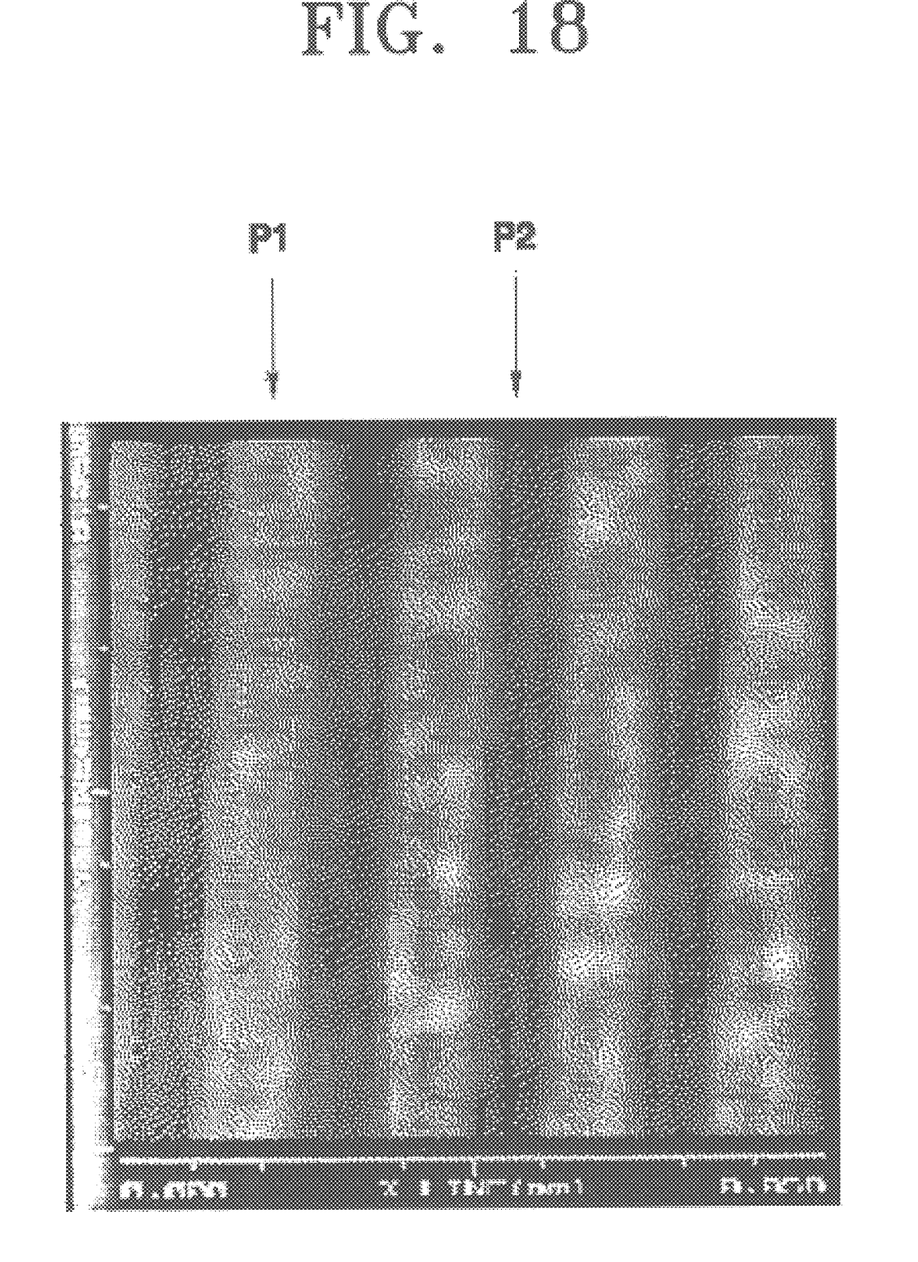
FIGS. 18 through 20 are photographs of the results of analyzing the crystalline defects of GaN substrates, which are manufactured by the first through third embodiments of the present invention, using micro PL mapping.
Figure 19:
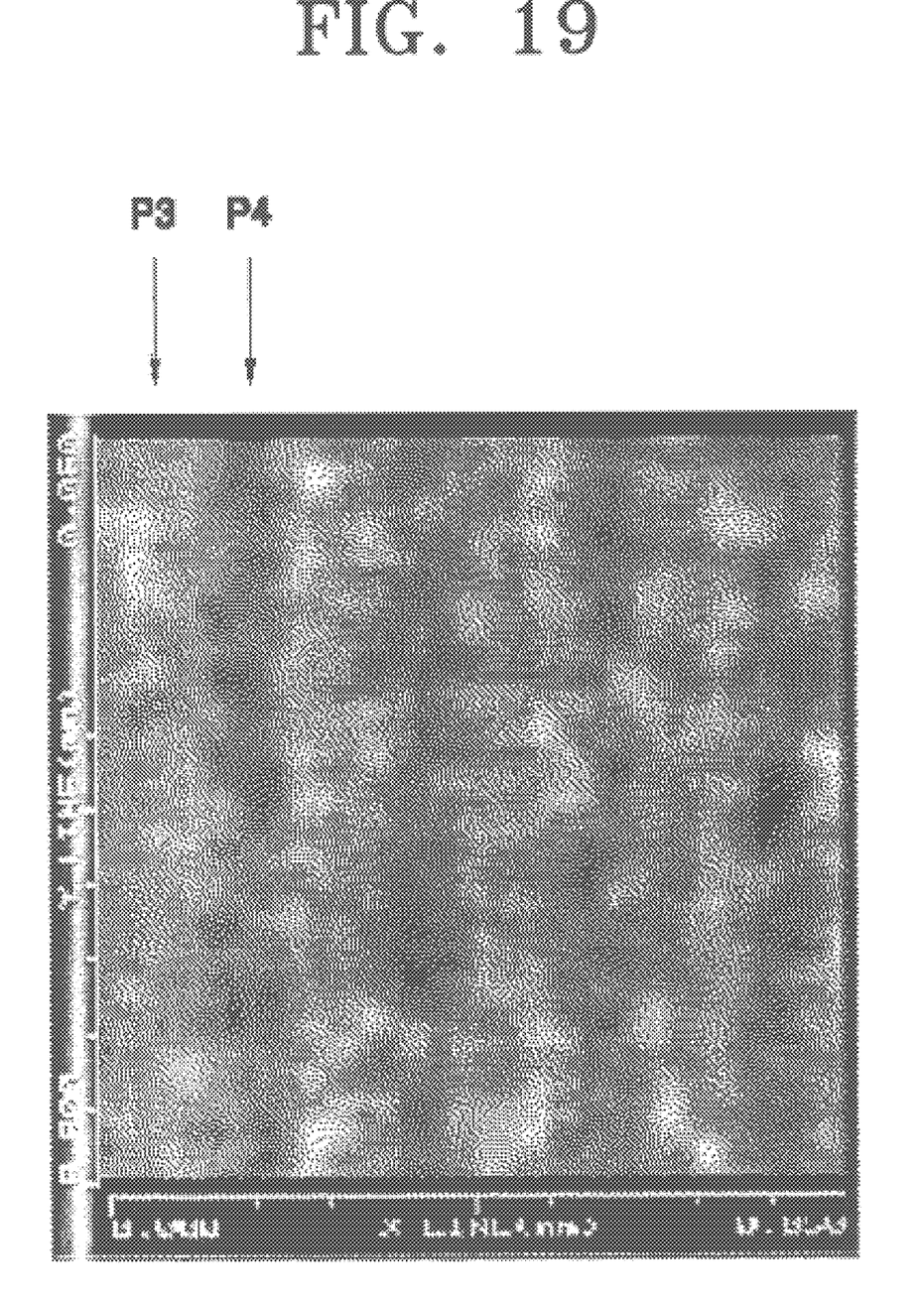
Figure 20:
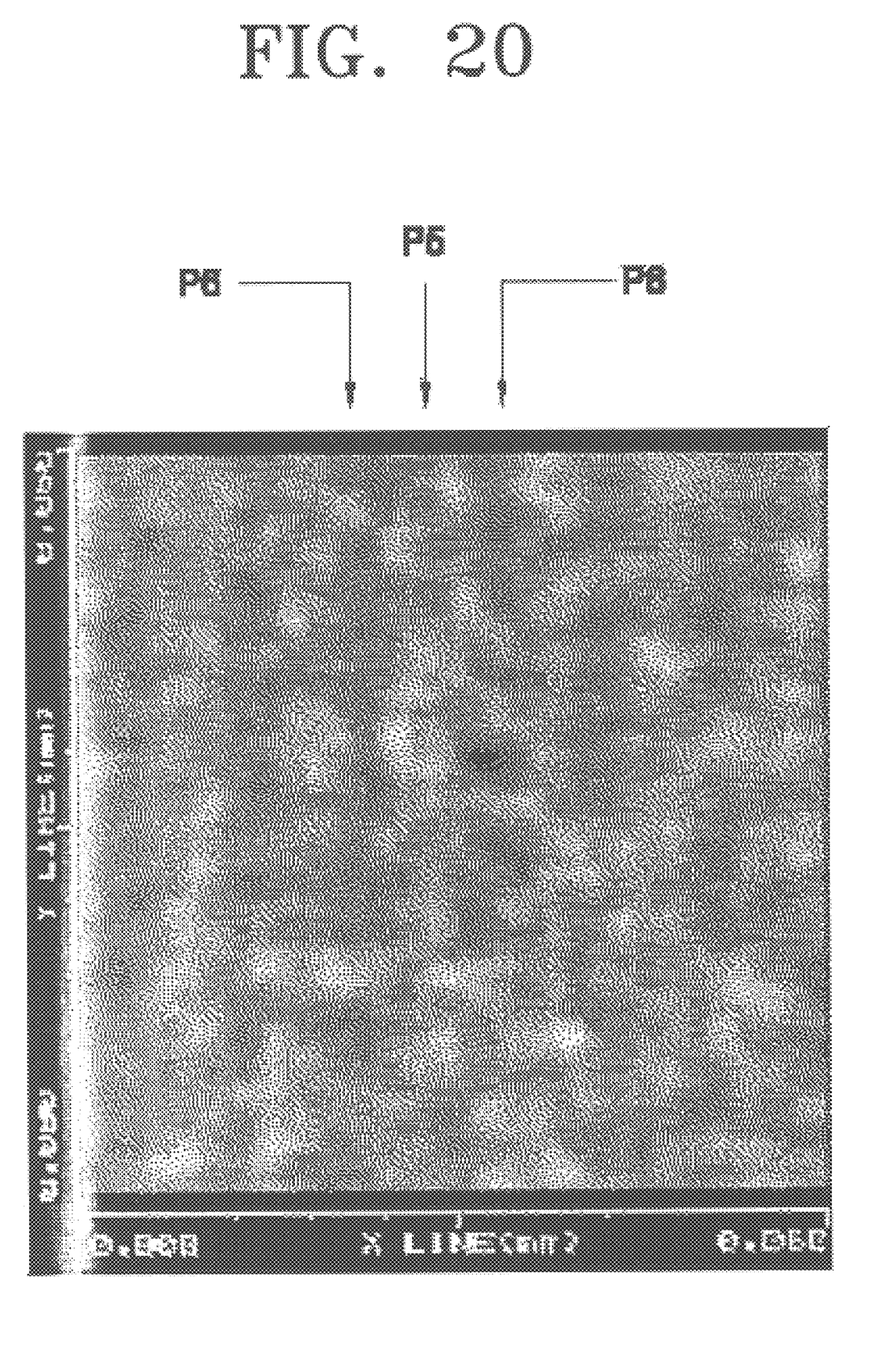

Meanwhile, micro PL mapping was performed to analyze the distribution of crystalline defects within each of the second semiconductor substrates 46, 48 and 52 formed according to the first through third embodiments, respectively, of the present invention. The results are shown in FIGS. 18 through 20. FIG. 18 is a photograph showing the result of analyzing the crystalline defects of the second semiconductor substrate 46 formed according to the first embodiment. FIGS. 19 and 20 are photographs showing the results of analyzing the crystalline defects of the second semiconductor substrates 48 and 52 formed according to the second and third embodiments, respectively.

Referring to FIG. 18, a bright portion P1 is a trench portion in which defects are reduced due to a lateral growth, and a dark portion P2 corresponds to a substrate between trenches.

In FIG. 19, bright and dark lines P3 and P4 are shown. Here, bright lines P3 means that defects are reduced due to a lateral growth in a trench region. In addition, as a result of observing an X-ray rocking curve, a single peak having a Full Width at Half Maximum (FWHM) of about 150 sec was found. This means that the second semiconductor substrate 48 does not have a tilt region and has an excellent crystallinity.

Referring to FIG. 20, bright and dark portions P5 and P6 are shown. It can be seen that an intensity at the bright portions P5 is higher than that at the dark portions P6. In addition, the area of the bright portions P5 is much greater than that shown in FIG. 18 or 19. It can be concluded from this fact that a much higher-grade semiconductor substrate can be obtained by growing a semiconductor substrate according to the third embodiment.

As described above, the present invention provides a GaN substrate manufacturing method characterized by using a GaN substrate having a few defects as a base and forming a GaN layer having a fewer defects on the GaN substrate. Here, a material layer such as a silicon oxide layer or a silicon nitride layer having different physical properties than a growing semiconductor substrate is not used, thereby overcoming a tilt problem attendant upon introduction of a different sort of material layer and realizing a uniform strain distribution. In addition, uniform heat conductivity is realized so that the uniformity of a growth surface is secured, thereby reducing the resistance of a device. Moreover, since a substrate and a material layer grown therefrom are the same kind, a vertical growth is carried out even at an etched portion of the substrate, thereby preventing a void from being formed within a GaN layer. As a result, a probability of a device cracking is increased, which can stabilize the structure of a device. In addition, instead of a sapphire substrate or a silicon carbide substrate, the same sort of semiconductor substrate as a semiconductor substrate to be grown, for example, a GaN substrate, is used so that problems related to an etch on a substrate according to prior art can be overcome, and a GaN layer having a lower defect density can be obtained.

While many matters are specifically described, they should not be construed as limiting the scope of the invention but should be construed as exemplary embodiments. For example, it will be understood by those skilled in the art that a pattern different from the trench 42 in the first and second embodiments or the first rugged portion 50 in the third embodiment may be formed on the surface of the first semiconductor substrate 40 acting as a base before forming a second semiconductor substrate, or the trench 42 is formed using a mask, and the mask may be used as the mask 44 covering over the substrate around the trench 42. Therefore, the scope of the present invention will be defined by the appended claims not by the embodiments described above.

What is claimed is:

1. A method of manufacturing a semiconductor substrate, comprising the steps of:

forming a first discontinuous portion in a III-IV compound semiconductor substrate to have first protrusions;

transforming the first discontinuous portion into a second discontinuous portion having second protrusions different from first protrusions of the first discontinuous portion using one method selected from the group consisting of etching and growth methods, wherein said first discontinuous portion includes a top surface that is parallel to the plane of said substrate; and forming a GaN thin film on the second protrusions of the III-V compound semiconductor substrate at a lateral growth rate fast enough to cover vertically grown GaN thin film with the laterally grown GaN thin film, so that the discontinuous portion is covered with the GaN thin film; and wherein the step of transforming the first discontinuous portion into the second discontinuous portion comprises ething the first discontinuous portion to transform the first protrusions into the second protrusions.

2. The method of claim 1, wherein said III-IV compound semiconductor substrate is a nitride semiconductor substrate.

3. The method of claim 1, wherein said III-IV compound semiconductor substrate is a GaN semiconductor substrate.

4. The method of claim 1, wherein the III-IV compound semiconductor substrate is formed on one of a sapphire substrate and a silicon carbide substrate.

5. The method of claim 1, wherein the step of forming said first protrusions in said first discontinuous portion in the III-IV compound substrate includes etching a III-IV compound substrate.

6. The method of claim 1, wherein the first protrusions of the first discontinuous portion comprise a plurality of protrusions having a trapezoidal cross-section.

7. The method of claim 1, wherein the second protrusions of the second discontinuous portion comprise a plurality of protrusions having a triangular cross-section.

8. The method of claim 1, wherein transforming the first discontinuous portion into the second discontinuous portion includes growing said III-IV compound semiconductor substrate at a temperature of 900–1100° C.

* * * * *